United States Patent
Thiagarajan et al.

(10) Patent No.: US 11,251,805 B2
(45) Date of Patent: *Feb. 15, 2022

(54) METHOD FOR FAST DETECTION AND AUTOMATIC GAIN ADJUSTMENT IN ADC BASED SIGNAL

(71) Applicant: Cypress Semiconductor Corporation, San Jose, CA (US)

(72) Inventors: Eashwar Thiagarajan, Bothell, WA (US); Erhan Hancioglu, Bothell, WA (US); Eric N. Mann, Issaquah, WA (US); Harold Kutz, Edmonds, WA (US); Amsby D Richardson, Jr., Lynnwood, WA (US); Rajiv Singh, Lynnwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/072,697

(22) Filed: Oct. 16, 2020

(65) Prior Publication Data
US 2021/0409034 A1 Dec. 30, 2021

Related U.S. Application Data

(63) Continuation of application No. 16/912,994, filed on Jun. 26, 2020, now Pat. No. 10,848,170.

(51) Int. Cl.
*H03M 1/00* (2006.01)
*H03M 1/18* (2006.01)
*H03G 3/30* (2006.01)

(52) U.S. Cl.
CPC ............... *H03M 1/18* (2013.01); *H03G 3/30* (2013.01)

(58) Field of Classification Search
CPC ............ H03M 1/18; H03M 1/00; H03G 3/30
USPC .................................. 341/139, 155
See application file for complete search history.

(56) References Cited

U.S. PATENT DOCUMENTS

| | | | |
|---|---|---|---|
| 5,995,033 A | 11/1999 | Roeckner et al. | |
| 7,199,739 B2* | 4/2007 | May ................... | H03H 17/0671 341/143 |
| 8,305,246 B2 | 11/2012 | Kinyua et al. | |
| 8,611,751 B2* | 12/2013 | Liu ........................ | H04J 14/06 398/98 |
| 8,644,427 B2 | 2/2014 | Porret et al. | |
| 9,025,963 B2 | 5/2015 | Malouin et al. | |
| 9,473,082 B2 | 10/2016 | Petrovic et al. | |
| 9,762,255 B1 | 9/2017 | Satoskar et al. | |
| 9,780,800 B1 | 10/2017 | Satoskar et al. | |
| 9,967,036 B2 | 5/2018 | Malouin et al. | |

(Continued)

OTHER PUBLICATIONS

USPTO Notice of Allowance for U.S. Appl. No. 16/912,994 dated Aug. 14, 2020; 8 pages.

*Primary Examiner* — Jean B Jeanglaude

(57) ABSTRACT

A method can include modulating an amplified analog signal into a digital data stream, filtering the digital data stream with a first filter, generating gain control values associated with amplified analog signal based on the filtered data stream with the first filter and filtering the digital data stream with a second filter, and generating output digital values associated with the amplified analog signal based on the filtered data stream with the second filter. Corresponding systems and devices are also disclosed.

21 Claims, 14 Drawing Sheets

(56) References Cited

U.S. PATENT DOCUMENTS

| | | |
|---|---|---|
| 2007/0176819 A1* | 8/2007 | May .................... H03H 17/0671 |
| | | 341/155 |
| 2011/0050471 A1* | 3/2011 | Kumar .................. H03M 3/368 |
| | | 341/143 |
| 2013/0039444 A1 | 2/2013 | Porret et al. |
| 2013/0259490 A1 | 10/2013 | Malouin et al. |
| 2015/0236795 A1 | 8/2015 | Malouin et al. |
| 2016/0099732 A1 | 4/2016 | Petrovic et al. |
| 2017/0163295 A1* | 6/2017 | Talty .................... H03M 1/662 |
| 2018/0294825 A1 | 10/2018 | Petrovic et al. |

* cited by examiner

ANALOG INPUT

ΣΔ OUTPUT

FAST DECIMATOR (BACKGROUND)

(BACKGROUND)

US 11,251,805 B2

METHOD FOR FAST DETECTION AND AUTOMATIC GAIN ADJUSTMENT IN ADC BASED SIGNAL

CROSS-REFERENCE TO RELATED APPLICATION

This application is a Continuation of U.S. patent application Ser. No. 16/912,994, filed Jun. 26, 2020, which is incorporated by reference herein its entirety.

TECHNICAL FIELD

The present disclosure relates generally to analog-to-digital converters (ADC), and more particularly to ADC having input amplifiers with automatic gain adjustment.

BACKGROUND

Many analog-to-digital converters (ADCs) can include a programmable gain amplifiers (PGAs) to accommodate wide ranges of analog input voltages. Automatic gain control (AGC) can be used to automatically change amplifier gain in response to an amplifier output signal.

FIG. 14 is a block diagram of a conventional ADC system 1401. Conventional ADC system 1401 can amplify an analog input signal with a PGA 1403. A sigma-delta (also referred to as delta-sigma) modulator 1407 with an adjustable gain 1405 can sample the amplified output to generate a digital data stream reflecting the magnitude of the analog input signal. The digital data stream can be digitally filtered and sampled with filter/decimator 1409. A digital filter can be a third order sinc filter and decimator for an oversampling ratio (OSR) of 64. An output of filter/decimator 1409 can be summed/accumulated to generate a final conversion result.

Referring still to FIG. 14, in an AGC operation, an analog input value can be applied to a comparator 1411. If an analog input value exceeds a range limit of the comparator 1411, it can generate an interrupt signal. In response to the interrupt, a processor 1413, according to predetermined instructions, can generate a gain value for PGA 1403, a modulator gain value 1405, and a new range value for comparator 1411.

A drawback to conventional ADC 1401 can be power consumption. A processor 1413 can draw an undue amount of current for some applications, including applications that require low power consumption, such as battery monitoring. Another drawback can be the amount of noise introduced by analog comparators.

FIG. 15 shows a block diagram of another conventional ADC system 1501. Conventional ADC system 1501 can have the same general conversion path as that shown in FIG. 14, including a PGA 1503, modulator gain stage 1505, sigma-delta modulator 1507, and filter/decimator 1509. Unlike FIG. 14, AGC can be provided logic 1515, which can detect amplitude change based on conversion results output from filter/decimator 1509. Logic 1515 can determine and input magnitude or magnitude change, and in response, adjust a gain value for PGA 1503 as well as modulator gain stage 1505.

A drawback to conventional ADC 1501 can be the delay between analog input signal change and the output from filter/decimator 1509. For some applications, the delay between analog signal change and gain adjustment provided by logic 1515 may be too long to meet a systems requirement.

It would be desirable to arrive at some way of providing analog-to-digital conversion that does not suffer from the drawbacks of conventional approaches.

DETAILED DESCRIPTION

Figure 1:
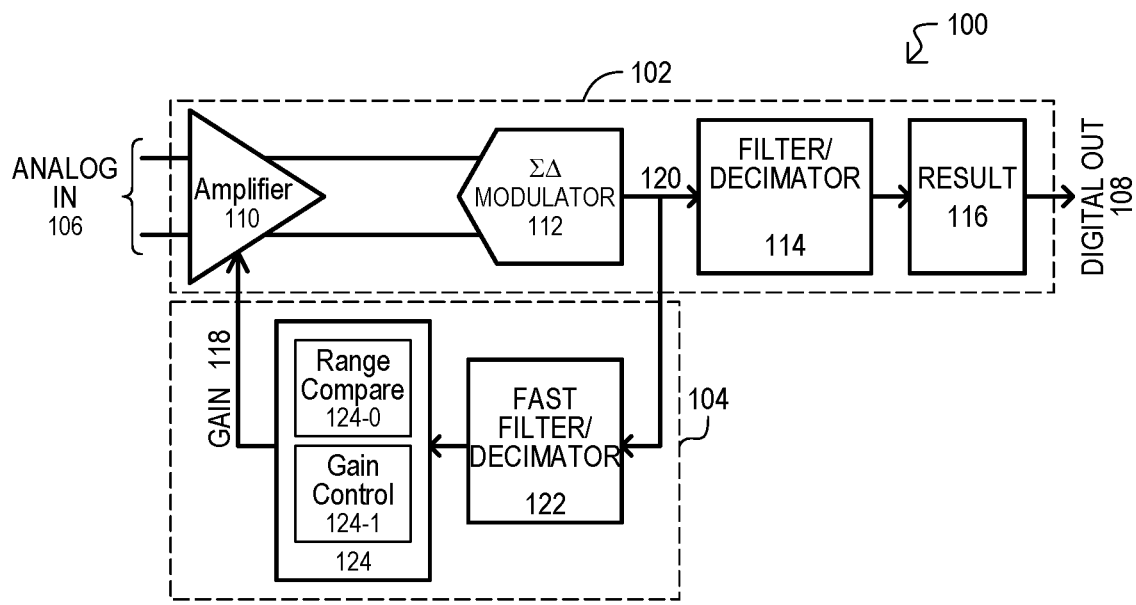
FIG. 1 is a block diagram of an analog-to-digital converter (ADC) according to an embodiment.

According to embodiments an analog-to-digital (ADC) can provide fast automatic gain control (AGC) without analog comparators by use of a fast digital detection loop that can detect analog input signal changes with digital circuits. The fast digital detection loop can operate in parallel with (and faster than) a conversion path that generates a final digital output value corresponding to the analog input signal.

In some embodiments, a fast digital detection loop can include a filter/decimator that generates output values faster than (albeit at lower resolution) than a filter/decimator in the conversion path.

In some embodiments, an ADC can also include a masking section which can mask the sigma-delta modulator output stream corresponding to a gain change event, to suppress transients that could be generated by a gain change. In some embodiments, a mask section can include a memory element that can output a previous digital data stream in place of that corresponding to a gain change event.

In some embodiments, a fast digital detection loop can include a first sinc filter, while the conversion path includes a higher order sinc filter than that of the fast digital detection loop.

In the various embodiments below, like items are referred to by the same reference characters, but with the leading digit(s) corresponding to the figure number.

FIG. 1 is a block diagram of an ADC 100 according to an embodiment. An ADC 100 can include a conversion path 102 and AGC loop 104. A conversion path 102 can receive an analog input signal 106 and generate digital output values 108 that represent the analog input signal 106. A conversion path 102 can include an amplifier 110, a sigma-delta modulator 112 (hereinafter referred to as a "modulator"), a filter/decimator 114 and a result section 116. An amplifier 110 can amplify analog input signal 106 according to a gain value 118. An amplified analog input signal can be provided to modulator 112, which can generate a stream of digital values 120 at a sampling rate (i.e., frequency Fs). A stream of digital values 120 can be single bit or multi-bit. A filter/decimator 114 can digitally filter and down sample the data stream 120. In some embodiments, a filter/decimator 114 can include a sinc type filter to filter out higher frequency components. A result section 116 can provide final digital conversion values 108.

It is understood that a conversion path 102 can include any other suitable processing section, including but not limited to: analog filters, buffers and/or additional digital filters.

AGC loop 104 can receive the stream of digital values 120 from modulator 112, and based on such values, selectively change a gain value 118 for amplifier 110. In some embodiments, AGC loop 104 can operate at a lower resolution than the filter/decimator of conversion path 102. AGC loop 104 can include a "fast" filter/decimator 122 and automatic circuits 124. A "fast" filter/decimator 122 can perform digital filtering and down sampling of the data stream 120, but at a faster rate as compared to filter/decimator 114 of the conversion path 102. In some embodiments, the fast filter/decimator 122 and the filter/decimator 114 of the conversion path can both include sinc filters, however, the fast filter/decimator 122 of the AGC loop 104 can be a lower order sinc filter than the filter/decimator 114 of the conversion path 102.

Automatic gain circuits 124 can determine a response of analog input signal 106 from filtered/down sampled data values output from fast filter/decimator 122, and according to such a determination, increase, decrease or maintain a gain value 118 for amplifier 110. In the embodiment shown, automatic gain circuits 124 can include range compare circuits 124-0 and gain control circuits 124-1. Range compare circuits 124-0 can determine, from filtered/down sampled digital values, if an analog input signal 106 is within one or more ranges. Based on such a determination, gain control circuits 124-1 can generate an appropriate gain value, if necessary. As is well understood, such an operation can include determining if an analog input signal 106 is at or has exceeded a low end of a range, and in response, increase a gain value, and determining if an analog input signal 106 is at or below a high end of a range, and in response, decrease a gain value.

AGC loop 104 can make amplifier gain determinations at a faster rate than conversion path 102 can arrive at digital output values 108. An AGC loop 104 may not include any processor circuits, and thus consume little power. Processor circuits can be circuits that execute operations in response to a set of instructions.

Figure 2:
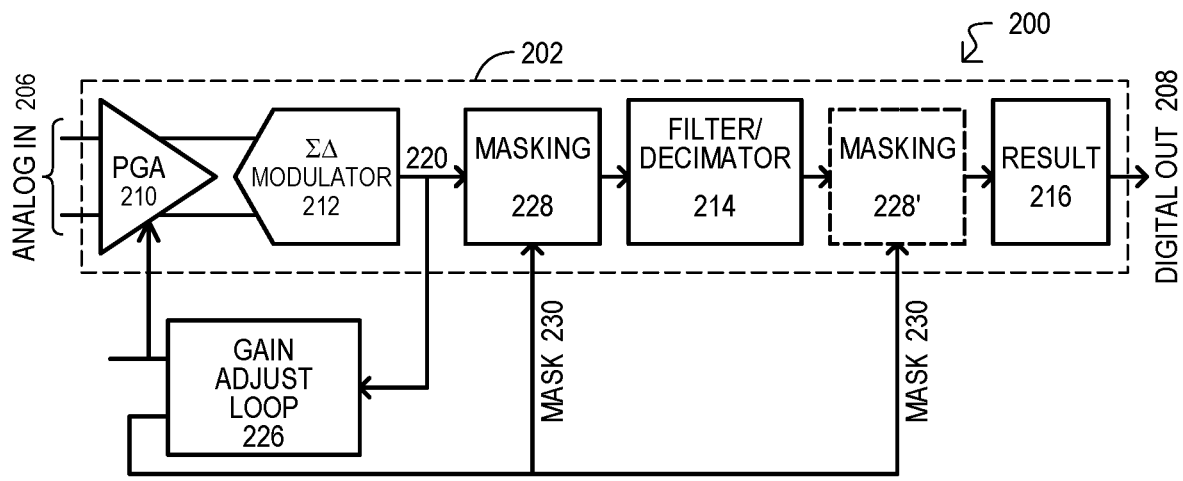
FIG. 2 is a block diagram of an ADC according to another embodiment.

FIG. 2 is a block diagram of an ADC 200 according to another embodiment. An ADC can include a conversion path 202 and a gain adjust loop 226. A conversion path 202 can include items like those shown in FIG. 1, including a modulator 222, a filter/decimator 214, and a result section 216, and such like items and operate in the same manner as described in FIG. 1. Unlike FIG. 1, an amplifier of conversion path 202 can be a programmable gain amplifier (PGA), and can also include masking circuit 228.

A masking circuit (228 and/or 228') can mask portions of a data stream 220 output from modulator 212 in response to a mask indication 230 provided by gain adjust loop 226. In some embodiments, masking circuit 228 can include one or more memory circuits that can store a running portion of data stream 220 and then output the stored data stream values, in lieu of the current data stream, in response to an active mask indication 230. However, masking can take any suitable form as will be described in more detail herein.

A masking circuit (228 and/or 228') can be located at various locations in the conversion path. As shown by masking circuit 228, a masking circuit 228 can mask data values as they are output from modulator 228. However, as shown by masking circuit 228', in other embodiments, masking can be performed at a "back-end" of the conversion path, masking data values following digital processing steps, including but not limited to digital filtering and/or decimation.

Gain adjust loop 226 can alter a gain value 218 for PGA 220 in response to the data stream 220 output from modulator 212. In addition, gain adjust loop 226 can activate mask indication 230 in the event there is a change in a gain value 218. Such an operation can mask portions of data stream 220 corresponding to a change in PGA gain, which can include transient and other undesirable effects. A gain adjust loop 226 may not include any processor circuits.

In operation, ADC 200 can receive an analog input signal 206. Conversion path 202 can generate output digital values 208 reflecting the analog input signal 206. At the same time, in the event a magnitude of analog input signal 206 rises or falls by predetermined amounts, gain adjust loop 226 can lower or increase gain value 218. When such changes in gain value occur, gain adjust loop 226 can activate mask indication 230, causing masking circuit 228 to alter a data stream output from modulator 212. It is understood that gain adjust loop 226 can delay the activation of mask indication 230 to establish when masking of a data stream occurs. In some embodiments, a masking duration (e.g., number of data values masked) can be determined by masking circuit 228. In addition or alternatively, a masking duration can be established with mask indication 230. A masking duration can be static or dynamic (e.g., programmable, vary according to gain change, etc.).

Figure 3:
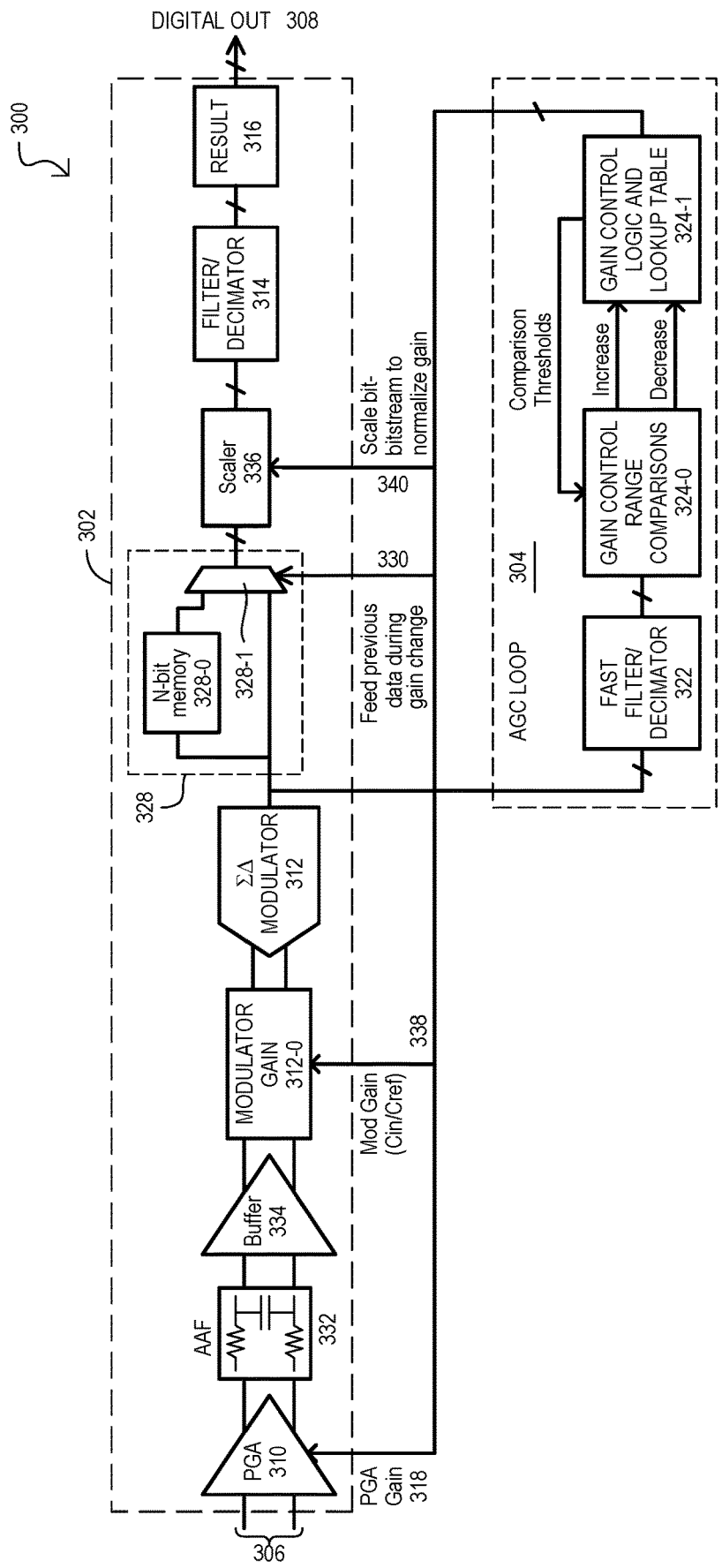
FIG. 3 is a block diagram of an ADC according to a further embodiment.

FIG. 3 is a block diagram of an ADC 300 according to a further embodiment. In some embodiments, ADC 300 can be one implementation of that shown in FIGS. 1 and/or 2. ADC 300 can include a conversion path 302 and AGC loop 304. A conversion path 302 can include a PGA 310, anti-aliasing filter (AAF) 332, buffer 334, modulator gain adjust 312-0, modulator 312, masking circuits 328, scaler 336, filter/decimator 314 and result section 316. PGA 310 can amplify an analog input signal 306 according to a PGA gain value 318, as described herein and equivalents. AAF 332 can restrict the bandwidth of a signal output from PGA, for example, according to the sampling rate of the ADC 300. Buffer 334 can buffer the resulting analog signal output from the AAF 332. A modulator gain adjust 312-0 can adjust the gain of the modulator 312 according to a modulator gain value 338. In some embodiments, a modulator gain value 338 can select the value of an input capacitance and reference capacitance for the modulator 312. A modulator 312 can sample the analog signal output from buffer 334 to generate a stream of digital data 320. A stream of digital data 320 can be multi-bit or single bit.

Masking circuits 328 can include a memory 328-0 and a multiplexer (MUX) 328-1. A memory 328-0 can store a predetermined amount of data stream values 320. A MUX 328-1 can selectively connect the data stream output from modulator 312 or values stored by memory 328-0 in response to a mask indication 330. A scaler 336 can digitally amplify data stream values output from MUX 328-1 according to a digital gain value 340. A filter/decimator 314 and a result section 316 can operate in the same manner as described for FIG. 1. A down sampled and filtered digital output signal 308 can be provided as a result.

AGC loop 304 can include a fast filter/decimator 322, a range compare section 324-0, and a gain lookup section 324-1. A fast filter/decimator 322 can operate in the same fashion as 122 described for FIG. 1. In response to the values provided by fast filter/decimator 322, range compare section 324-0 can increase, decrease (or maintain) gain settings for the ADC 300. Based on increase or decrease indications from range compare section 324-0, gain look-up section 324-1 can generate PGA gain values 318, modulator gain values 338, digital gain values 340 as well as a mask indication 330. In addition, gain look-up section 324-1 can provide new comparison thresholds for the range compare section 324-0. In some embodiments, a gain look-up section 324-1 can include one or more look-up tables (LUTs) for fast generation of values. AGC loop 304 may not include any processor circuits.

In operation, an analog input signal 306 can be amplified, filtered, and modulated to generate a data stream 320. The data stream 320 can be provided to filter decimator 314 which can generate an ADC conversion result 316. At the same time, AGC loop 304 can process the data stream 320 from modulator 312 to determine of the analog input signal 306 is at an upper or lower range limit.

If an analog input signal 306 falls above or below a range limit, range compare section 324-0 can signal an increase or decrease in gain. In response, gain look-up section 324-1 can provide a new PGA gain value 318, and if appropriate, a new modulator gain value 338 and/or digital gain value 340. In addition, a mask indication 330 can be activated.

A change in PGA gain value 318 can result in undesirable effects in the output of PGA 318 (e.g., transient settling, step response artifacts). Such undesirable effects can be sampled by modulator 312 and reflected in a resulting data stream 320. The activation of the mask indication 330 can be timed to coincide with this portion of the data stream 320. Accordingly, while such possibly undesirable values are output from modulator 312, MUX 328-1 can output values stored in memory 328-0. Once the PGA transition period has passed (i.e., adverse effects of gain change are not expected), a mask indication 330 can be deactivated, and the MUX 328-1 can return to providing the data stream 320 output by the modulator 312.

FIGS. 4A to 4D are block diagrams of an ADC 400 according to another embodiment. ADC 400 can be one implementation of any of those shown in FIGS. 1 to 3. ADC 400 can include a conversion path 402 and AGC loop 404. A conversion path 402 can have items like those of FIG. 3, including a PGA 410, AAF 432, buffer 434, modulator gain adjust 412-0, modulator 412, masking circuits 428, scaler 436, filter/decimator 414-0/1 and result section 416. Such items can operate in the same or an equivalent fashion as corresponding items in FIG. 3.

Figure 4A:
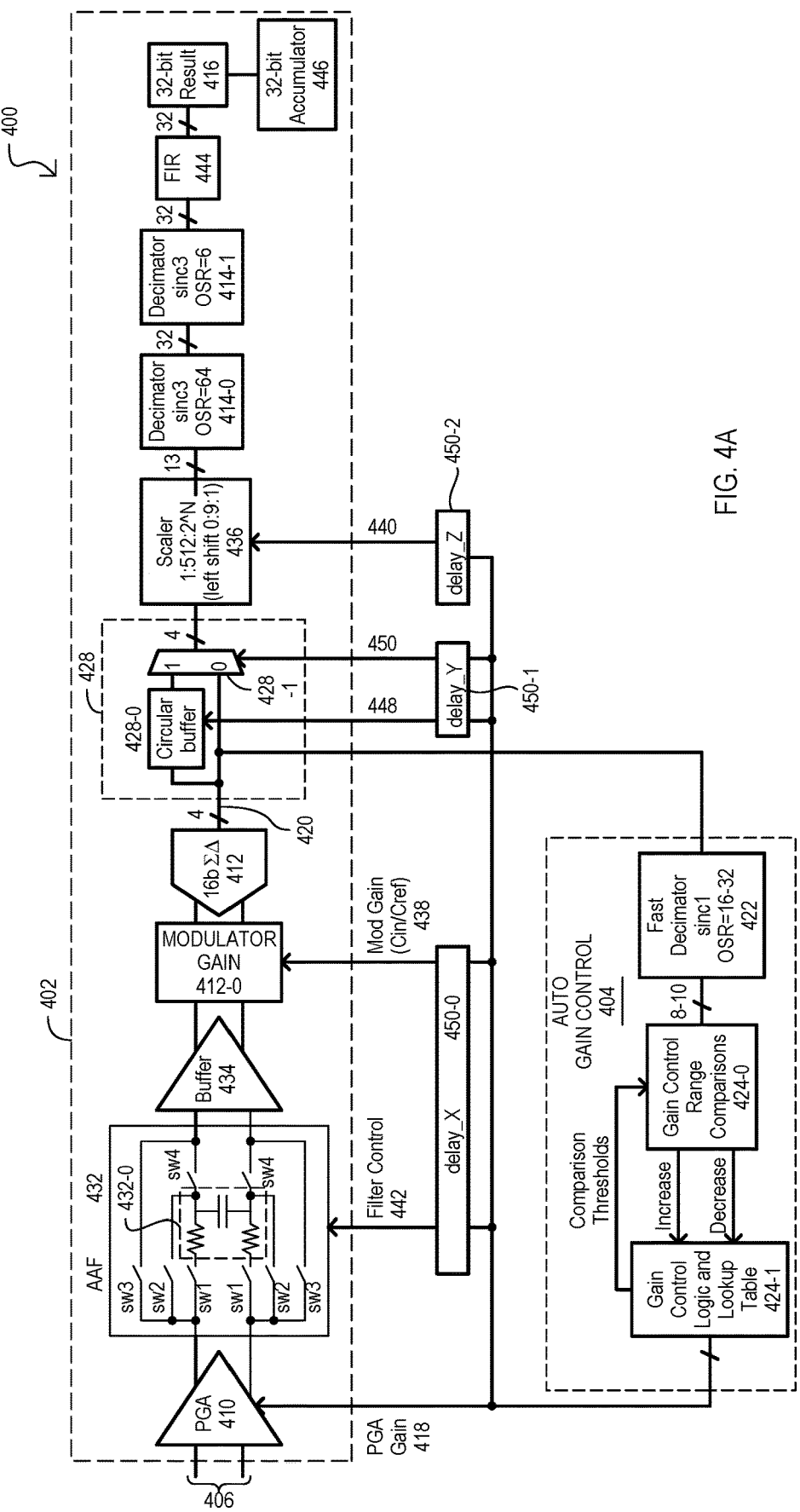
FIGS. 4A to 4D are a detailed block diagrams of an ADC and corresponding operations according to embodiments.

FIG. 4A can differ from FIG. 3 in that an AAF 432 can have switch elements sw1 to sw4. The operation of the switch elements for AAF 432 will be described in more detail with reference to FIGS. 4B-0 to 4B-2. A modulator 412 can be a sixteen-bit sigma-delta modulator that can output conversion values as a stream of four-bit values. The operation of masking circuits 428, scaler 436, and decimator 414-0 will be described with reference to FIG. 4C. Outputs from filter/decimator 414-0/1 can be provided to a finite impulse response (FIR) filter 444 to arrive at 32-bit results. A 32-bit accumulator 446 can add up samples, which can further smooth and output result and/or reduce the effects of noise. AGC loop 404 can include a filter/decimator 422, a range compare section 424-0, and a gain lookup section 424-1.

ADC 400 can include various delay 450-0 to -2. Delays (450-0 to -2) can be set to time their corresponding circuit sections with PGA gain change events. That is, a PGA gain change can result in unwanted effects, such as transients. Delay 450-0 can result in switch settings within AAF 432 and a modulator gain 412-0 being in place just prior to, or as a PGA gain change affects an output of PGA 410. Effects of delays 450-0/1 will be described further with reference to FIG. 4C.

Figures 0, 4B:
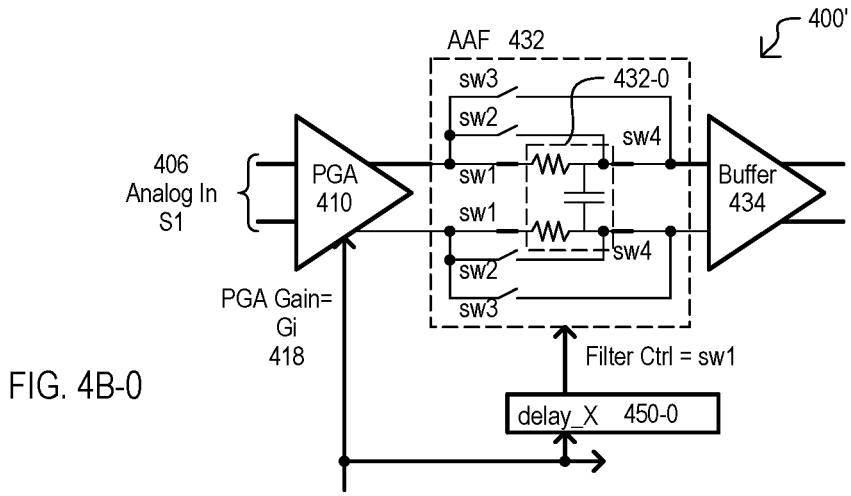
Figures 1, 4B:
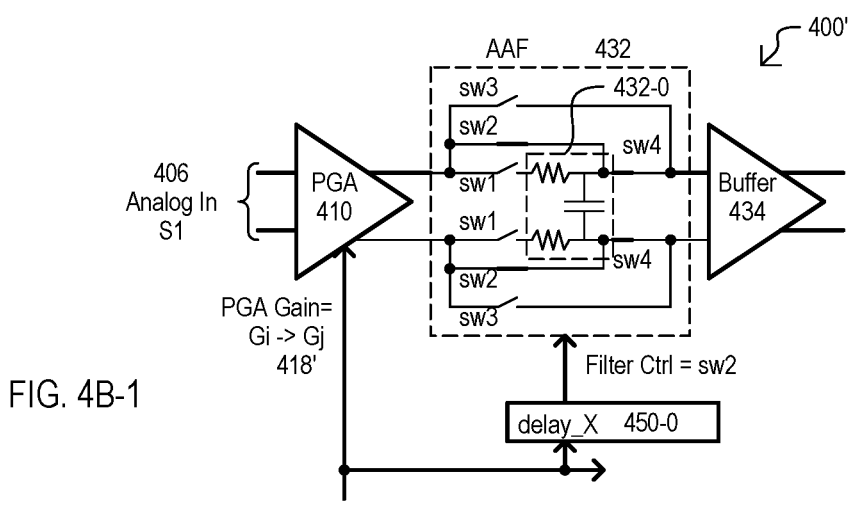
Figures 2, 4B:
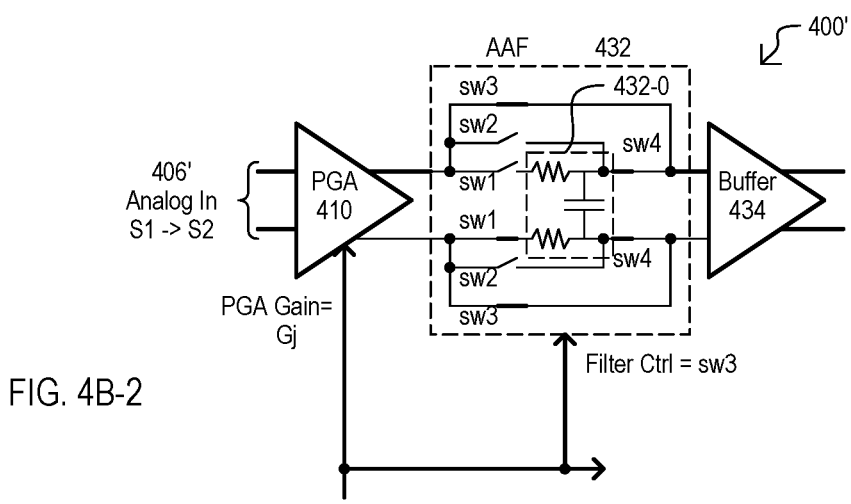

FIGS. 4B-0 to 4B-2 are a sequence of diagrams showing various configurations of an AAF 432 according to an embodiment. FIGS. 4B-0 to 4B-2 show a portion of ADC 400' including PGA 410, AAF 432, buffer 434, and delay 450-0.

FIG. 4B-0 shows AAF 432 while a PGA gain 418 remains constant. Within AAF 432, switch elements sw1 can be closed, while sw2 and sw3 are open, applying the output of PGA 410 to analog filter elements 432-0.

FIG. 4B-1 shows AAF 432 during a PGA gain change 418'. A switch control signal can cause switch elements sw1 within AAF 432 to open, and switch elements sw2 can close, bypassing the filter resistors. Such an arrangement can enable an analog signal to settle faster.

FIG. 4B-2 shows AAF 432 during an input signal source change 406'. An input signal source change 406' can result when an ADC is used to process different signals. Within AAF 432, switch elements sw3 can close (while switch elements sw1 and sw2 are open), bypassing all filter elements. Such an arrangement can enable an analog signal to very rapidly switch from a previous signal (i.e., S1) level to the new input signal (i.e., S2) level.

Figure 4C:
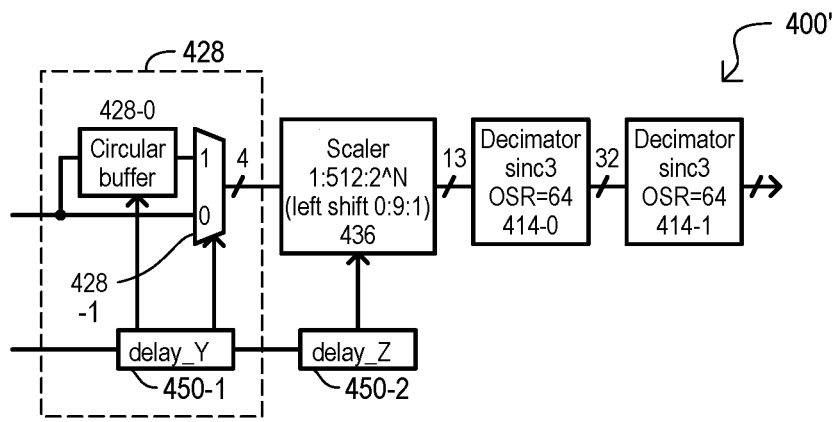

FIG. 4C shows a portion of ADC 400' including masking circuits, scaler 436 and filter/decimator 414-0/1. Masking circuits 428 can include a circular buffer 428-0 that stores a set amount of 4-bit (x4) values output from modulator 412. A size of circular buffer 428-0 can be static or can be programmable. While stored data stream values from circular buffer 428-0 are output via MUX 428-1, circular buffer 428-0 may not store any new data. In this way, by operation of circular buffer 428-0 and MUX 428-1, a data stream from a modulator (which can be corrupted) can be disconnect from filter/decimator 414-0/1. The duration of such an operation can be established by delay 450-1 (delay_Y). Masking circuits can take any suitable form. Examples of other possible masking circuits are described with reference to FIGS. 7A to 7D.

Referring still to FIG. 4C, a scalar 436 can implement a digital gain (i.e., left shift) that can vary from 0:9, based on a digital gain value 440, and provide a 13-bit output value. Filter/decimator 414-0/1 can include a first stage 414-0 with a third order sinc (sinc3) filter with an oversampling ratio (OSR) of 64, and a second stage 414-1 with a sinc3 filter and OSR of 6. Filter decimator 414-0/1 can provide 32-bit values. Delay 450-1 can control how long circular buffer 428-0 activates (i.e., outputs a stored stream of data values) with respect to a PGA gain change. Delay 450-2 can control when scaler 436 increases a digital gain value.

Figure 4D:
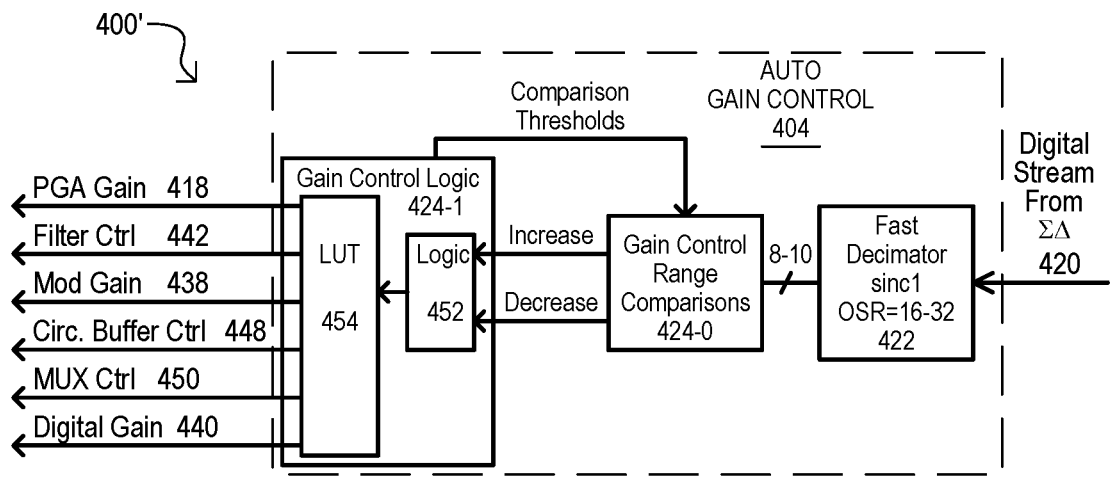

FIG. 4D shows AGC loop 404 in more detail. AGC 404 can include a filter/decimator 422, range compare section 424-0 and gain look-up section 424-1. Filter/decimator 422 can include a first order (sinc1) filter 422 and have an OSR of 16-32. In the embodiments, shown a filter decimator 422 can provide output values of 8-10 bits. It is noted that filter/decimator 422 can arrive at values faster than filter/decimator 414-0/1 of conversion path 402, enabling AGC loop 404 to respond to modulator data stream 420 faster than conversion path 402. A range compare section 424-0 can generate range increase or decrease indications. Within gain look-up section 424-1 logic 452 can generate look-up values based on increase/decrease indications. A LUT can output PGA gain values 418, as well as other corresponding ADC configuration values (e.g., filter control 442, modulator gain 438, buffer control 448, MUX control 450 and digital gain 440). AGC loop 404 may not include any processor circuits.

Figure 5:
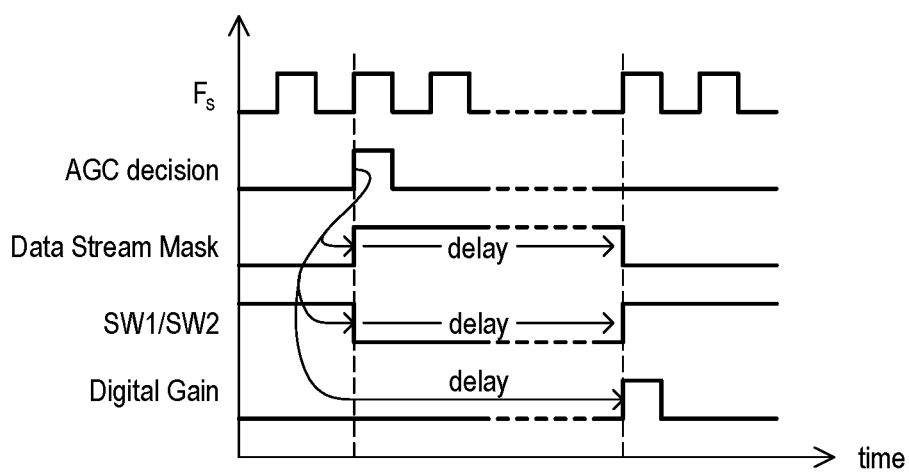
FIG. 5 is a timing diagram showing delays that can be included in the embodiment of FIG. 4A.

FIG. 5 is a timing diagram showing one example of operations in a ADC like that of FIGS. 4A-4D. FIG. 5 includes the following waveforms: "Fs" can be a sampling clock that can indicate the frequency at which sigma-delta conversions are generated by a modulator; "AGC decision" can transition high when an AGC loop initiates a PGA gain change; "Data Stream Mask" can transition high to mask a modulator data stream to prevent unwanted artifacts (e.g., a current data stream is replaced by a previously stored data stream); "SW1/SW2" can transition to bypass resistors in an AAF; "Digital Gain" can transition high to alter a digital gain in a scaler, after a predetermined delay (e.g., delay_Z).

In some embodiments, a duration of "Data Stream Mask" and "SW1/SW2" can be controlled by delay values (e.g., delay_Y and delay_X). The various delay values (delay_X, delay_Y, and delay_Z) can be programmable.

FIGS. 6A to 6E are timing diagrams showing simulation results for an ADC like that shown in FIGS. 4A to 4D.

Figure 6A:
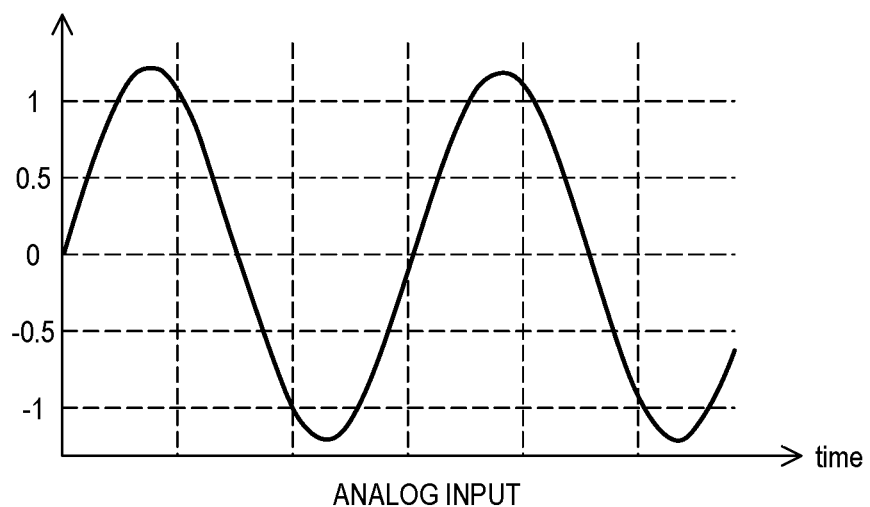
FIGS. 6A to 6E are waveforms showing the operation of the ADC shown in FIG. 4A.

FIG. 6A shows a test analog input signal (e.g., 406) provided to a PGA (410).

Figure 6B:
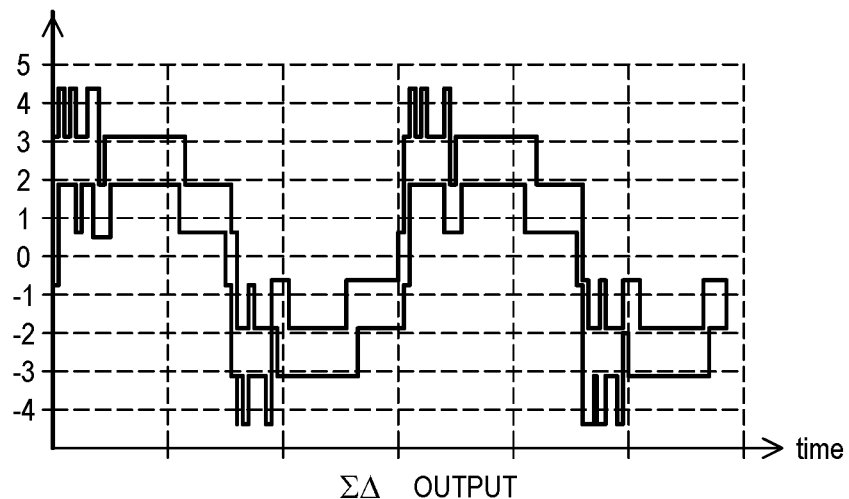

FIG. 6B shows a representation of a corresponding sampled data stream (e.g., 420) output from a modulator (412).

Figure 6C:
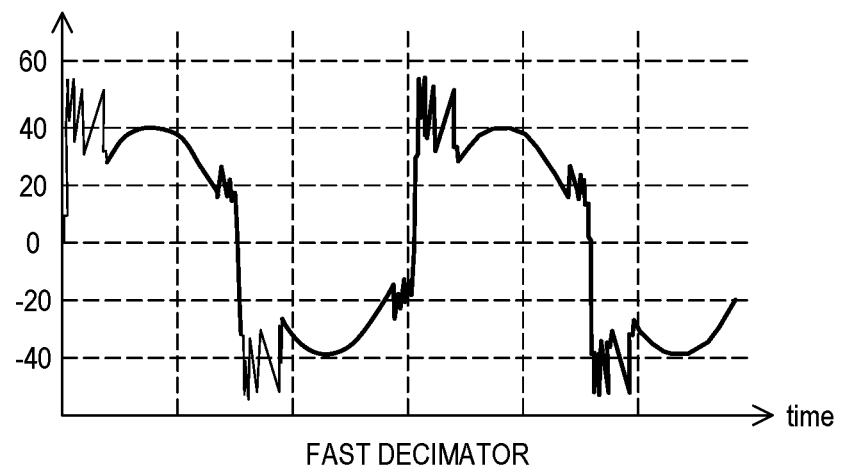

FIG. 6C shows a representation of values generated by a "fast" filter/decimator (422). While such values may not have the resolution of the higher order filter/decimator (414-0/1), such values are sufficient to determine needed gain changes.

Figure 6D:
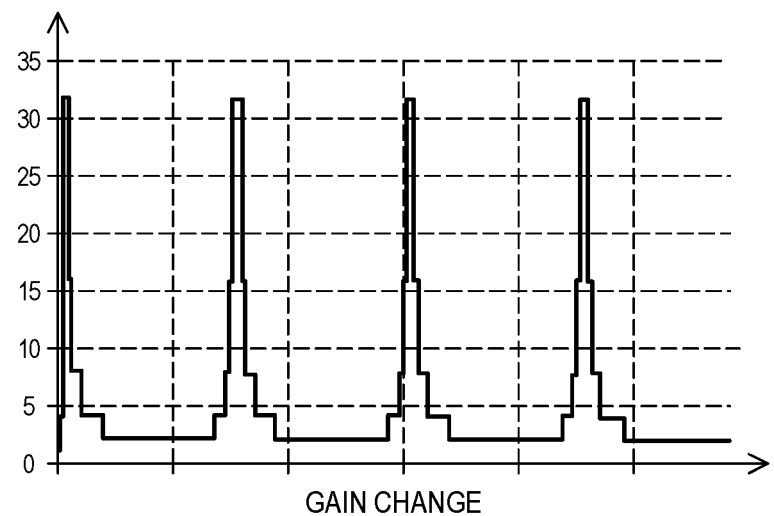

FIG. 6D shows gain changes (e.g., 418) generated for PGA (410) by AGC loop (404) in response to the test analog signal.

Figure 6E:
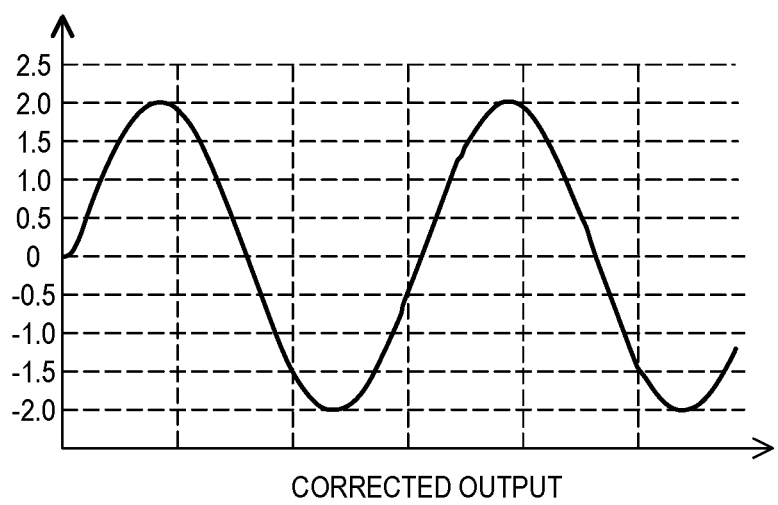

FIG. 6E shows a representation of digital output values generated by conversion path (402).

An AGC loop (e.g., 404) as described herein can provide fast detection of changes in an analog input signal with digital circuits. Thus, automatic gain adjustments can be accomplished with low power. Further, a fast filter/decimator can provide fast response, with low noise.

Masking circuits (e.g., 428) as described herein can enable dynamic adjustments to the gain in the ADC conversion path with little or no corruption in data output, by preventing slow transient responses from propagating through the ADC conversion path.

Figure 7A:
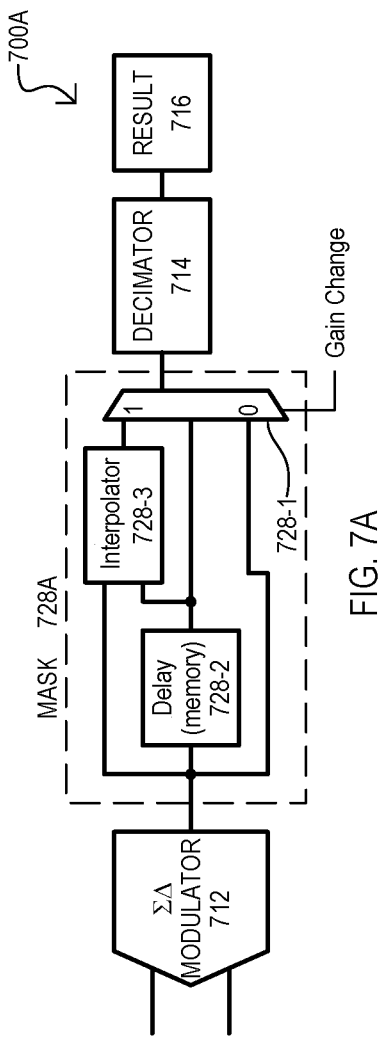
FIGS. 7A and 7D are block diagrams of masking circuits according to embodiments.
Figure 7B:
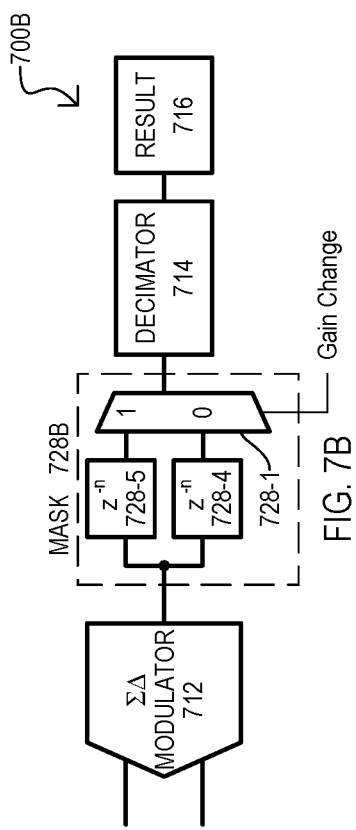
Figure 7C:
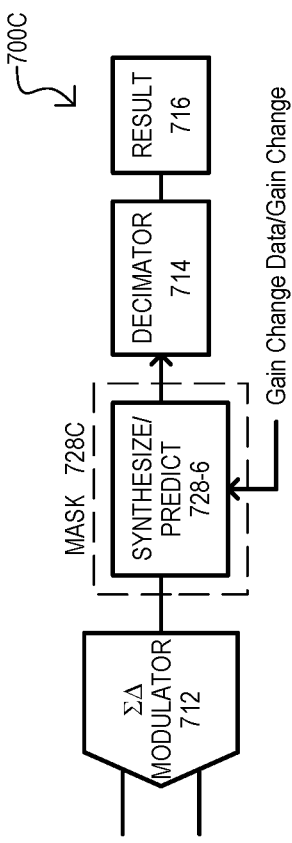

FIGS. 7A to 7C are diagrams showing other masking circuits that can be included in embodiments.

FIG. 7A shows a portion of ADC 700A in which a mask circuit 728A can include a data MUX 728-1, delay stage 728-2 and interpolating circuit 728-3. While a corresponding chopping circuit is inactive, data MUX 728-1 outputs the data stream received at input "0". At the same time, interpolation circuit 728-3 can generate a stream of interpolated data values generated from the current data stream and that stored by delay stage 728-2. When the corresponding chopping circuit is active, data MUX 728-1 can output the interpolated data stream values. In some embodiments, a delay value for delay stage 728-2 be programmable and/or can be changed on-the-fly.

FIG. 7B shows a portion of ADC 700B in which a mask circuit 728B can include a data MUX 728-1, a first delay element 728-4 and a second delay element 728-5. Delay element 728-5 can have a same delay as 728-4. However, in alternate embodiments, such delays can be different. While a corresponding chopping circuit is inactive, data MUX 728-1 outputs the data stream received at input "0" which is delayed by first delay element 728-4. When the corresponding chopping circuit is active, data MUX 728-1 can output the data stream received at input "1" which is delayed by second delay element 728-5. In some embodiments, a delay value for second delay element 728-5 and/or 728-4 can be programmable and/or can be changed on-the-fly.

FIG. 7C shows a portion of ADC 700C in which a mask circuit 728C can include a synthesize circuit 728-6. Synthesize circuit 728-6 can synthesize data stream values in response to a gain change event in lieu of data values output from modulator 712. Absent a gain change event, synthesize circuit 728-6 can output the data stream from modulator 712. In some embodiments, synthesized data stream values can be generated with gain change data. Gain change data can include any of: a gain prior to gain change, a gain after gain change, an input signal level prior to gain change, or an input signal level after a gain change. In some embodiments, a synthesize circuit 728-6 can include a look-up table, or the like, to generate synthesized data stream values in response to gain change data and/or data stream values output from modulator 712.

Figure 7D:
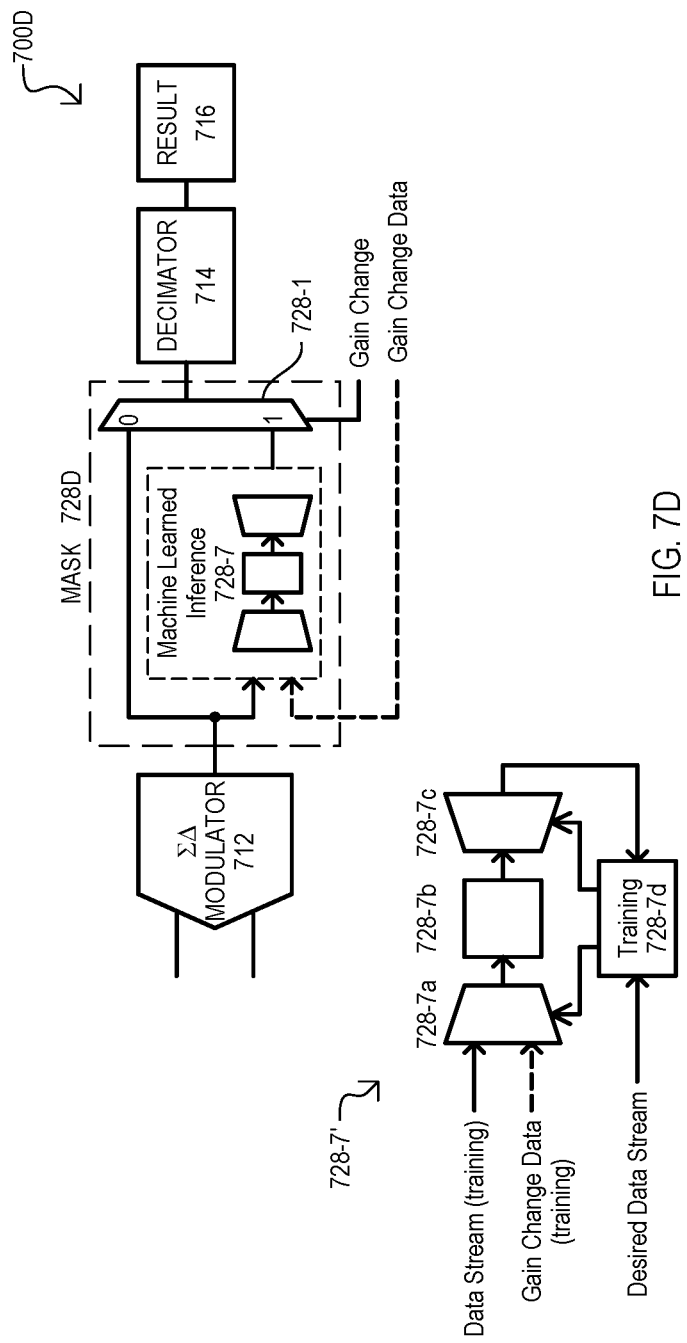

FIG. 7D shows a portion of ADC 700D in which a mask circuit 728D can include a machine learning (ML) engine 728-7 and MUX 728-1. ML engine 728-7 can include a machine learning inference engine trained to generate masking (e.g., corrected) data stream values from data stream values that include undesirable effects, such as those resulting from a gain change. In some embodiments, ML engine 728-7 can also receive gain change data as input values. Absent a gain change event, data MUX 728-1 outputs the data stream received at input "0" (i.e., the output of modulator 712). In the event of a gain change event, data MUX 728-1 can output data stream values from the ML engine 728-7.

An ML engine 728-7 can take any suitable form. FIG. 7D shows one example of an ML engine 728-7' that can be included in embodiments. ML engine 728-7' is shown in a training configuration. When trained, an ML engine 728-7' can include an encoder 728-7a, latent space 728-7b, a decoder 728-7c, and a training agent 728-7d. Data stream values output from an amplifier undergoing a gain change (Data Stream (training)) can be applied to an encoder 728-7a, which can encode such values into a latent space 728-7b. Latent space values 728-b can be decoded by decoder 728-7c to generate inferred data stream values. A training agent 728-7d can compare inferred data stream values with desired data stream values (e.g., an amplifier response without unwanted errors/artifacts). Based on such comparisons, training agent 728-7d can revise encoder 728-7a and/or decoder 728-7c. In some embodiments, encoder 728-7a and/or decoder 728-7c can include an artificial neural network, with neural weights adjusted by training agent 728-7d.

While the embodiments of FIGS. 1 to 7D have shown various ADCs and corresponding methods, additional methods will now be described.

Figure 8:
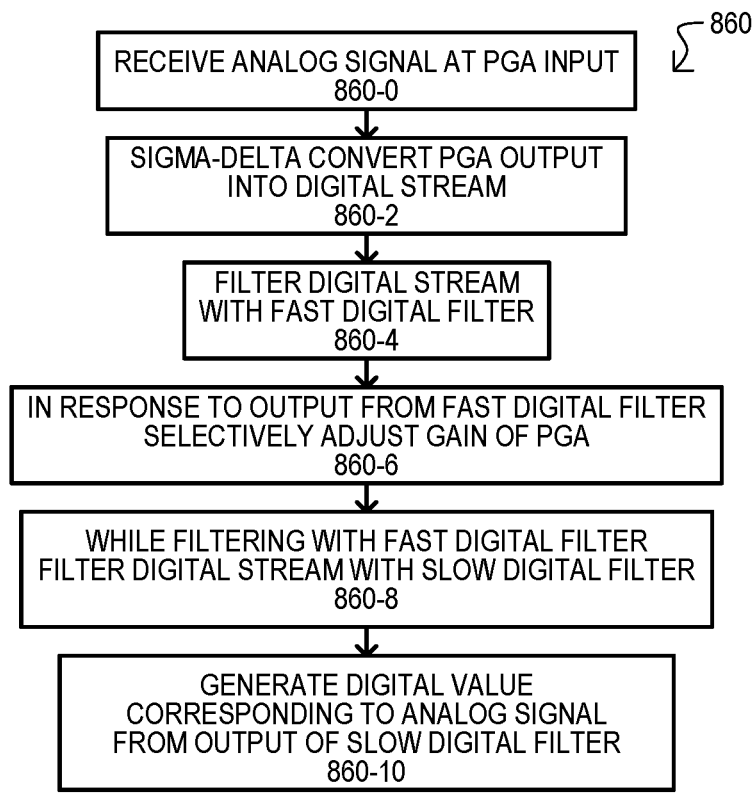
FIG. 8 is a flow diagram of a method according to an embodiment.

FIG. 8 is a flow diagram of a method 860 according to an embodiment. A method 860 can include receiving an analog input signal at a PGA input 860-0. An output of the PGA can be sigma-delta converted into a digital stream 860-2. Such an action can include any suitable conversion operation and can result in an output data stream at a sampling rate. A data stream can be multi-bit or as small as a one-bit data stream. The data stream can be filtered with a "fast" digital filter 860-4. Such an action can include any suitable digital filter, and in some embodiments can include a sinc type filter. In response to an output of the fast digital filter, a gain of the PGA can be selectively adjusted 860-6. Accordingly, for some filter output values, a gain can be increased, or decreased, or not changed.

Referring still to FIG. 8, while the data stream is filtered with the fast digital filter, the same data stream can be filtered with a "slow" digital filter 860-8. A slow digital filter can generate filtered results at a slower rate than fast digital filter (of 860-6). In some embodiments, a slow digital filter can provide higher resolution results than a fast digital filter. A digital value corresponding to the analog signal can be generated from the output of the slow digital filter 860-10.

Figure 9:
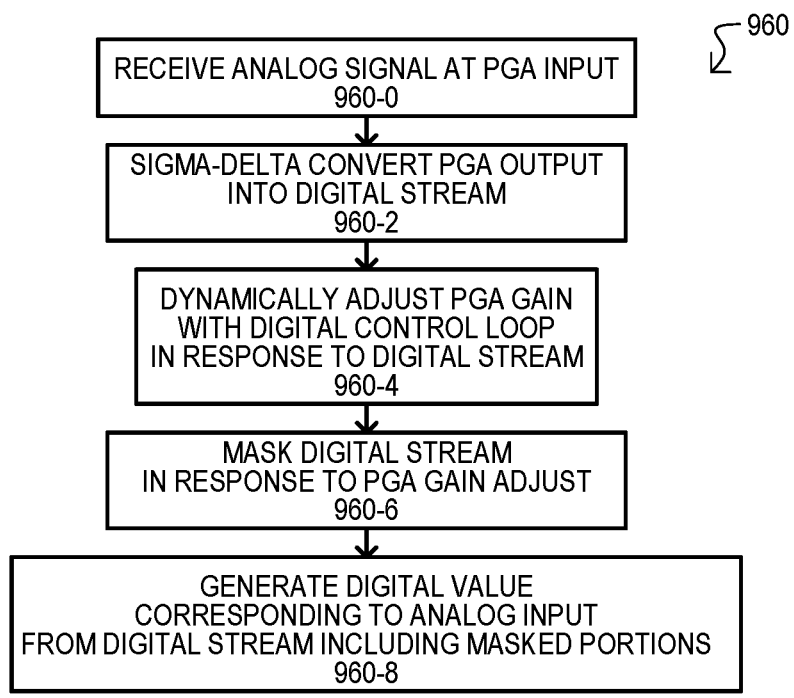
FIG. 9 is a flow diagram of a method according to another embodiment.

FIG. 9 is a flow diagram of a method 960 according to another embodiment. A method 960 can include receiving an analog signal at a PGA input 960-0. An output of PGA can be sigma-delta converted into a digital stream 960-2. Such actions can include any of those described for 860-2 and equivalents. A PGA gain can be dynamically adjusted with a digital control loop in response to the digital stream 960-4. A digital control loop can include only digital circuits.

In response to a PGA gain adjustment, the digital stream can be masked 960-6. Such an action can include replacing or altering the digital stream generated by a sigma-delta modulator during the gain change. This can include portions of the data stream preceding and/or following the gain change. Replacing a data stream can include using substitute data stream values in place of those data stream values generated during the gain change. Substitute data stream values can include previously stored values. Previously stored values can be the data stream values immediately preceding the gain change. Altering a data stream can include performing arithmetic or logic operations on the data stream values. As but two of many possible examples, data stream values corresponding to the gain change can be averaged with previous data stream values and/or subject to an interpolation operation with respect to other data stream values, such as previously stored data stream values.

A digital value corresponding to the analog signal can be generated from the digital stream, including the masked portions of the digital stream 960-8.

Figure 10:
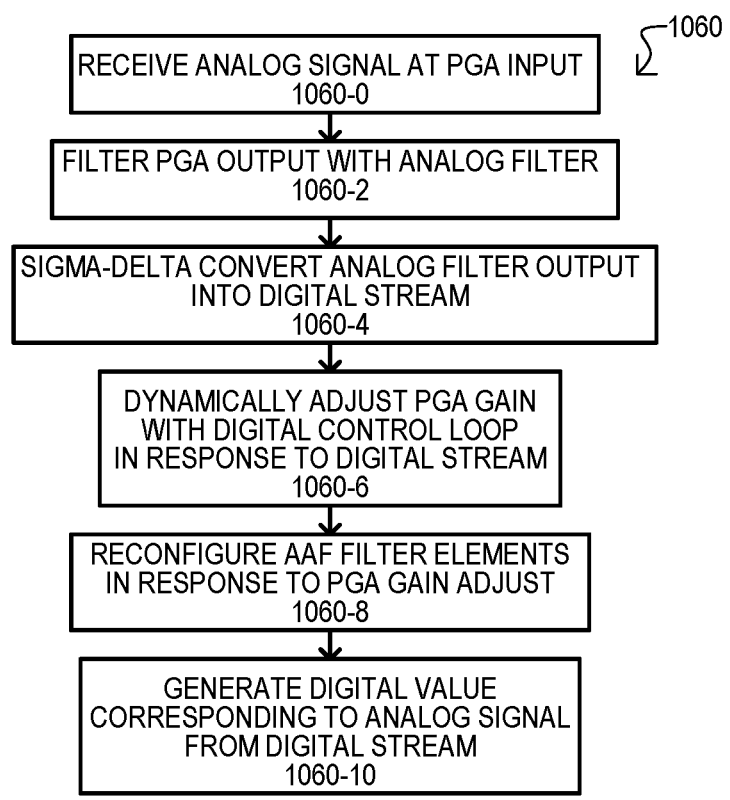
FIG. 10 is a flow diagram of a method according to a further embodiment.

FIG. 10 is a flow diagram of a method 1060 according to a further embodiment. A method 1060 can include receiving an analog signal at a PGA input 1060-0. An output of PGA can be filtered with an analog filter 1060-2. In some embodiments, an analog filter can include an AAF. An output of the analog filter can be sigma-delta converted into a digital stream 1060-4. Such actions can include any of those described for 860-2 and equivalents. A PGA gain can be dynamically adjusted with a digital control loop in response to the digital stream 1060-6.

Analog filter elements can be reconfigured in response to a PGA gain adjust 1060-8. Such an action can include activating switches or equivalents within the analog filter. In some embodiments, such action can include bypassing all or part of an input resistance to enable faster settling of the analog signal.

A digital value corresponding to the analog signal can be generated from the digital stream 1060-10.

Figure 11:
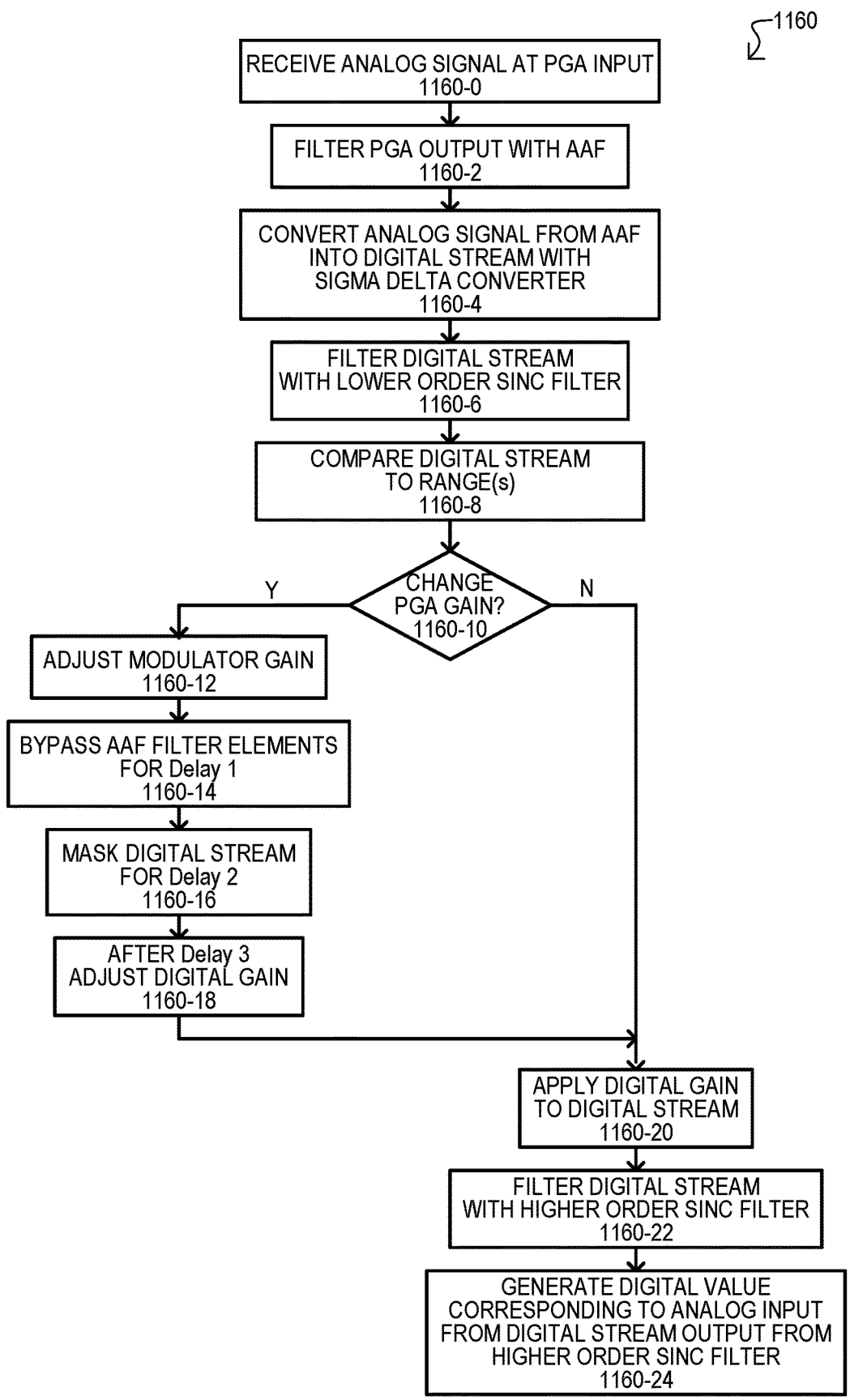
FIG. 11 is a flow diagram of a method according to another embodiment.

FIG. 11 is a flow diagram of a method 1160 according to another embodiment. A method 1160 can include receiving an analog signal at a PGA input 1160-0. An output of the PGA can be filtered with an AAF 1160-2. An analog signal from the AAF can be sigma-delta converted into a digital stream 1160-4. Such actions can include any of those described for 860-2 and equivalents. The digital stream can be filtered with a lower order sinc filter 1160-6. The digital stream can be compared to one or more range values 1160-8. Such an action can indicate if a PGA gain setting for the conversion path should be changed.

If the PGA gain is changed (Y from 1160-10), a modulator gain can be adjusted 1160-12. In some embodiments, such an action can include changing one or more input capacitances to the sigma-delta converter. Filter elements of the AAF filter can be bypassed for a predetermined delay (Delay 1) 1160-14. The digital stream can be masked for a predetermined delay (Delay 2) 1160-16. Such an action can include any of the digital stream masking approaches described herein or equivalents. After a predetermined delay (Delay 3), a digital gain can be adjusted 1160-18. The various delays (Delay 1, 2, 3) can be programmable, can be different from one another, or can be the same.

The digital gain can be applied to the digital stream 1160-20. Such an action can include processing the data stream with a scaler circuit or the like. The digital stream can be filtered with a higher order sinc filter 1160-22. Such an action can include using a sinc filter having a higher order than the lower order sinc filter. A digital value corresponding to the analog signal can be generated from the digital stream output from the higher order sinc filter 1160-24.

While embodiments can include ADC circuits, ADC systems and ADC methods, embodiments can also include other systems.

Figure 12:
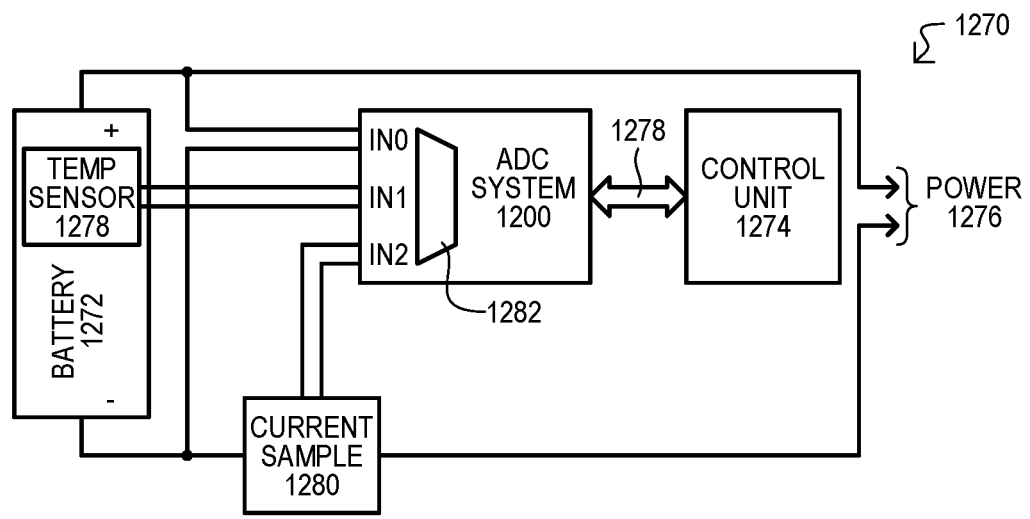
FIG. 12 is a block diagram of a system according to an embodiment.

FIG. 12 is a block diagram of a battery monitoring system 1270 according to an embodiment. A system 1270 can include a battery 1272, a control unit 1274, a current sampler 1280, and an ADC system 1200. Power 1276 can be provided from battery 1272 (i.e., battery is discharging) and/or provided to battery 1272 (i.e., battery is charging). A battery 1272 can include one or more temperature sensors 1278.

An ADC system 1200 can take the form of any of those described herein, or equivalents, and can provide accurate conversion, with fast, low power, low noise automatic gain control. In the embodiment shown, ADC system 1200 can generate digital values corresponding to analog signals provided by current sampler 1280. In addition or alternatively, ADC 1200 can generate digital values corresponding analog temperature readings from temperature sensor(s) 1278, as well as voltage readings (e.g., terminal voltage) for battery 1272. In some embodiments, ADC 1200 can include an input MUX 1282 for selectively connecting different analog input signals to the ADC 1200.

Digital values generated by ADC system 1200 can be transmitted to control unit 1274 over bus system 1278. It is noted that while a control unit 1274 can have processors and the like, such processors are not used by ADC 1200 for analog-to-digital conversion.

Figure 13:
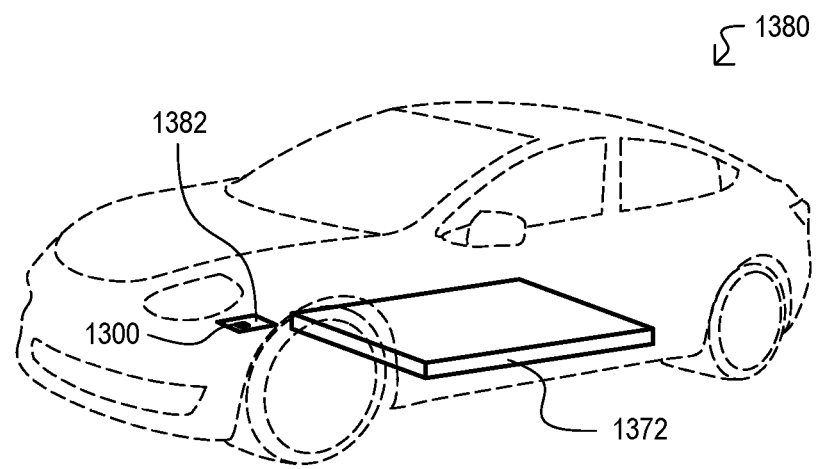
FIG. 13 is a diagram of a system according to another embodiment.
Figure 14:
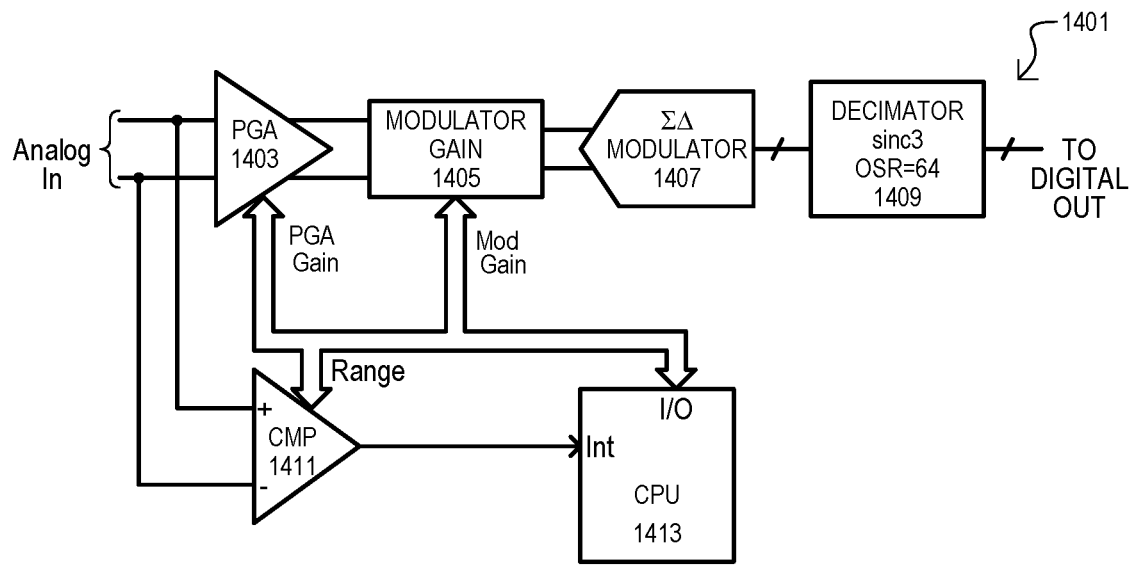
FIG. 14 is a block diagram of a conventional ADC.
Figure 15:
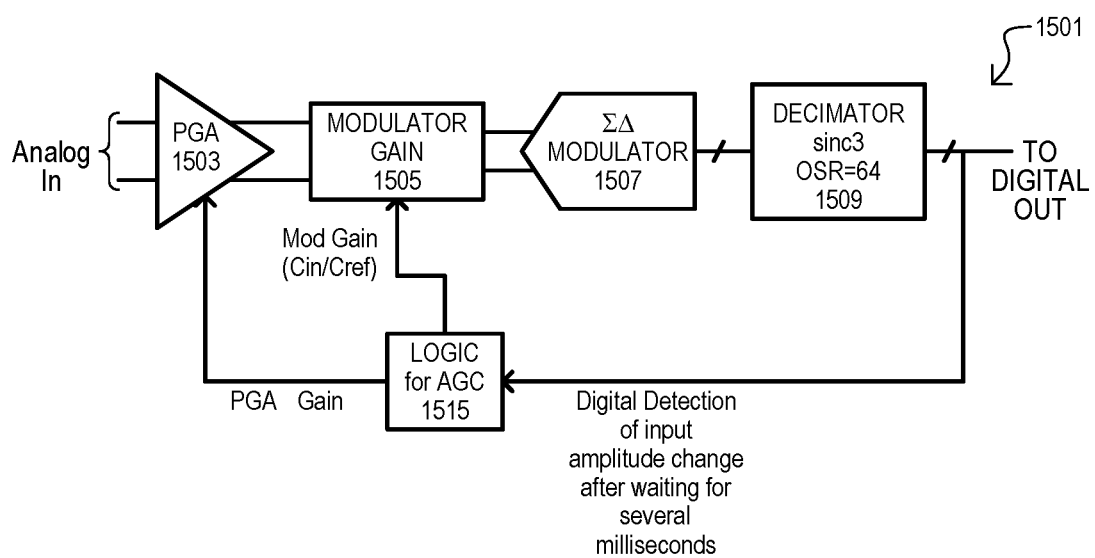
FIG. 15 is a block diagram of another conventional ADC.

FIG. 13 is a diagram of an automobile system 1380 according to an embodiment. A system 1380 can include a battery 1372 and an intelligent battery sensor 1382. An intelligent battery sensor 1382 can include an ADC system 1300. An ADC system 1300 can take the form of any of those described herein, or equivalents, and can generate digital signals corresponding to operations of battery 1372, including by not limited to terminal voltage, charge current and/or discharge current.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method for an analog-to-digital converter (ADC), the method comprising:
   modulating, by a sigma-delta modulator of the ADC, an amplified analog signal into a digital data stream;
   performing, by a digital control loop of the ADC, operations that comprise:
      filtering the digital data stream with a first digital filter to generate a first filtered data stream; and
      generating a gain control value associated with the amplified analog signal based on the first filtered data stream;
   while the digital data stream is being filtered with the first digital filter, filtering the digital data stream with a second digital filter to generate a second filtered data stream;
   wherein the first digital filter filters the digital data stream faster than the second digital filter; and
   generating output digital values corresponding to the amplified analog signal based on the second filtered data stream.

2. The method of claim 1, wherein the operations performed by the digital control loop further comprise:
   determining an amplitude range associated with the amplified analog signal based on the first filtered data stream; and
   generating the gain control value based on the amplitude range.

3. The method of claim 1, wherein the operations performed by the digital control loop further comprise generating a mask indication for masking portions of the second filtered data stream.

4. The method of claim 3, further comprising applying the mask indication based on the digital data stream output by the sigma-delta modulator.

5. The method of claim 4, wherein applying the mask indication further comprises:
   storing previous data values of the digital data stream output by the sigma-delta modulator; and
   in response to generating the gain control value, providing to the second digital filter the previous data values of the digital data stream instead of current data values of the digital data stream.

6. The method of claim 4, wherein applying the mask indication further comprises:
   generating interpolated data values of the digital data stream based on current data values and previous data values of the digital data stream output by the sigma-delta modulator; and
   in response to generating the gain control value, providing to the second digital filter the interpolated data values of the digital data stream instead of the current data values of the digital data stream.

7. The method of claim 4, wherein applying the mask indication further comprises delaying portions of the digital data stream output by the sigma-delta modulator based on one or more time delay values.

8. The method of claim 4, wherein applying the mask indication further comprises:
   synthesizing data values in response to generating the gain control value; and
   providing to the second digital filter the synthesized data values instead of current data values of the digital data stream.

9. The method of claim 4, wherein applying the mask indication further comprises:
   using a machine learning engine to synthesize data values in response to generating the gain control value; and
   providing to the second digital filter the synthesized data values instead of current data values of the digital data stream.

10. The method of claim 9, wherein using the machine learning engine comprises training the machine learning engine to generate a desired digital data stream.

11. The method of claim 3, further comprising masking portions of the second filtered data stream with the mask indication based on the second filtered data stream output by the second digital filter.

12. The method of claim 3, wherein the operations performed by the digital control loop further comprise activating the mask indication in response to generating the gain control value.

13. The method of claim 3, wherein:
   the operations performed by the digital control loop further comprise generating a digital gain value based on the first filtered data stream; and
   the method further comprises scaling the digital data stream based on the digital gain value.

14. The method of claim 1, wherein:
   the operations performed by the digital control loop further comprise generating a modulation gain value and a time delay value based on the first filtered data stream; and
   the method further comprises applying the modulation gain value by the sigma-delta modulator based on the time delay value.

15. The method of claim 1, wherein:
   the operations performed by the digital control loop further comprise generating a time delay value based on the first filtered data stream; and
   the method further comprises:
      amplifying an analog input signal by an amplifier;
      filtering the output of the amplifier with an anti-aliasing filter (AAF) to generate the amplified analog signal;

changing a gain of the amplifier based on the gain control value; and in response to changing the gain of the amplifier, altering configuration of the AAF based on the time delay value.

16. The method of claim 1, wherein:

the operations performed by the digital control loop further comprise:

generating a time delay value based on the first filtered data stream; and generating a mask indication for masking portions of the second filtered data stream; and the method further comprises, based on the time delay value, performing operations that comprise:

applying the mask indication based on the digital data stream output by the sigma-delta modulator;

storing previous data values of the digital data stream output by the sigma-delta modulator; and in response to generating the gain control value, providing to the second digital filter the previous data values of the digital data stream instead of current data values of the digital data stream.

17. The method of claim 1, wherein:

the operations performed by the digital control loop further comprise generating a time delay value and a digital gain value based on the first filtered data stream; and the method further comprises scaling the digital data stream based on the time delay value and the digital gain value.

18. The method of claim 1, wherein the operations performed by the digital control loop further comprise:

determining an amplitude range associated with the amplified analog signal based on the first filtered data stream; and in response to increase or decrease of the amplitude range, looking up and outputting control values to control operation of the ADC.

19. The method of claim 18, wherein the control values include one or more of a filter control value, a modulation gain value, a buffer control value, a multiplexer control value, and a digital gain value.

20. The method of claim 1, further comprising:

amplifying, by an amplifier, an analog input signal to generate the amplified analog signal; and changing a gain of the amplifier based on the gain control value.

21. The method of claim 20, wherein the analog input signal corresponds to one of a terminal voltage, a charge current, a discharge current, and a temperature reading of a battery in an electric vehicle.

* * * * *